United States Patent
An et al.

(10) Patent No.: US 10,580,835 B2
(45) Date of Patent: Mar. 3, 2020

(54) DISPLAY PANEL

(71) Applicant: Samsung Display Co., Ltd., Yongin-Si, Gyeonggi-Do (KR)

(72) Inventors: Jin Sung An, Seongnam-si (KR); Seung Woo Sung, Cheonan-si (KR); Se Wan Son, Yongin-si (KR); Wang Woo Lee, Osan-si (KR); Ji Seon Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/125,562

(22) Filed: Sep. 7, 2018

(65) Prior Publication Data

US 2019/0267433 A1 Aug. 29, 2019

(30) Foreign Application Priority Data

Feb. 27, 2018 (KR) .......................... 10-2018-0023885

(51) Int. Cl.
| | | |
|---|---|---|
| *H01L 33/00* | (2010.01) | |
| *H01L 27/32* | (2006.01) | |
| *H01L 51/00* | (2006.01) | |
| *H01L 51/52* | (2006.01) | |
| *G09G 3/3225* | (2016.01) | |
| *G09G 3/3266* | (2016.01) | |

(52) U.S. Cl.
CPC ...... *H01L 27/3223* (2013.01); *H01L 27/3248* (2013.01); *H01L 27/3258* (2013.01); *H01L 27/3276* (2013.01); *H01L 51/0096* (2013.01); *H01L 51/5253* (2013.01); *G09G 3/3225* (2013.01); *G09G 3/3266* (2013.01)

(58) Field of Classification Search
CPC ............. H01L 27/3223; H01L 27/3248; H01L 27/3225; H01L 27/127; H01L 27/1214
See application file for complete search history.

(56) References Cited

U.S. PATENT DOCUMENTS

| | | | |
|---|---|---|---|
| 8,710,506 B2 | 4/2014 | Liu | |
| 9,553,138 B2* | 1/2017 | Kim | ..................... H01L 27/3276 |
| 2014/0292827 A1* | 10/2014 | Kang | ....................... G09G 3/20 345/690 |
| 2015/0380687 A1* | 12/2015 | Yim | ..................... H01L 27/3244 257/40 |
| 2018/0075797 A1* | 3/2018 | Park | ..................... G09G 3/2092 |

FOREIGN PATENT DOCUMENTS

| | | |
|---|---|---|
| KR | 10-2017-0090208 A | 8/2017 |
| KR | 10-2017-0126051 A | 11/2017 |

* cited by examiner

*Primary Examiner* — Hsien Ming Lee
(74) *Attorney, Agent, or Firm* — Innovation Counsel LLP

(57) ABSTRACT

A display panel includes: an active area and a peripheral area adjacent to the active area, wherein the active area includes a display area including a plurality of emitting pixels and a non-display area including a plurality of non-emitting pixels, an emitting pixel of the plurality of emitting pixels includes a light-emitting element, and a non-emitting pixel of the non-emitting pixels does not include any light-emitting element or includes a pseudo-light-emitting element that is not capable of emitting light.

19 Claims, 15 Drawing Sheets

DISPLAY PANEL

CROSS-REFERENCE TO RELATED APPLICATION

This application claims priority to and the benefit of Korean Patent Application No. 10-2018-0023885 filed in the Korean Intellectual Property Office on Feb. 27, 2018, the disclosure of which is incorporated herein by reference in its entirety.

BACKGROUND

(a) Technical Field

The present disclosure relates to a display panel.

(b) Description of the Related Art

A display device such as an organic light emitting diode (OLED) display includes a display panel including a plurality of pixels for displaying images. Each pixel includes a pixel electrode for receiving a data signal, and the pixel electrode is connected to at least one transistor to receive a voltage.

Recently, there have been demands for display devices in various forms and for various applications. For example, display devices may include a display panel that has a display area in a non-quadrangular form such as a circle or an oval.

The above information disclosed in this Background section is only for enhancement of understanding of the background of the present disclosure, and therefore it may contain information that does not form a prior art that is already known to a person of ordinary skill in the art.

SUMMARY

The present disclosure provides a display panel with a non-quadrangular display area.

An exemplary embodiment of the present disclosure provides a display panel including an active area and a peripheral area adjacent to the active area, wherein the active area includes a display area including a plurality of emitting pixels and a non-display area including a plurality of non-emitting pixels, an emitting pixel of the plurality of emitting pixels includes a light-emitting element, and a non-emitting pixel of the non-emitting pixels does not include any light-emitting element.

The non-display area may be adjacent to the display area.

A boundary between the non-display area and the display area may include a first curved edge.

The first curved edge may not overlap any of the plurality of emitting pixels or the plurality of non-emitting pixels in a plane view.

The display panel may further include a gate driver disposed in the peripheral area and a plurality of gate lines electrically connected to the gate driver, and at least one of the plurality of gate lines may extend in a first direction, may cross the first curved edge, and may pass through the non-display area and the display area.

The display panel may further include a substrate that has an asymmetric form with respect to a reference line extending in a first direction.

A boundary of the active area may include the first curved edge and at least one second curved edge facing the first curved edge, and the substrate may include a third curved edge extending in parallel to the first curved edge.

The peripheral area may include a first peripheral area adjacent to the display area and a second peripheral area adjacent to the non-display area, and the second peripheral area may be electrically connected to a circuit board.

The non-display area may include a linear side facing the first curved edge, and the linear side may form a boundary between the non-display area and the second peripheral area.

The light-emitting element of the emitting pixel may include: a first transistor; a first insulating layer having a first contact hole disposed on a conductive region of the first transistor; a first connecting member electrically connected to the conductive region of the first transistor through the first contact hole; a second insulating layer having a second contact hole formed in the first connecting member; a first pixel electrode electrically connected to the first connecting member through the second contact hole; a third insulating layer including a first opening disposed in the first pixel electrode; a first emission layer disposed in the first opening; and a first common electrode disposed on the first emission layer, wherein the non-emitting pixel of the non-emitting pixels includes a pseudo-light-emitting element that is not capable of emitting light, and the pseudo-light-emitting element may include a configuration of the light-emitting element of the emitting pixel excluding at least one of constituent elements of the light-emitting element of the emitting pixel among: a second transistor; a third contact hole formed in the first insulating layer and disposed on a conductive region of the second transistor; a second connecting member electrically connected to the conductive region of the second transistor through the third contact hole; a fourth contact hole formed in the second insulating layer and disposed on the second connecting member; a second pixel electrode electrically connected to the second connecting member through the fourth contact hole; a second opening formed in the third insulating layer and disposed on the second pixel electrode; a second emission layer disposed in the second opening; and a second common electrode disposed on the second emission layer.

Another embodiment of the present disclosure provides a display panel including an active area and a peripheral area adjacent to the active area, wherein the active area includes a display area including a plurality of emitting pixels, and a non-display area including a plurality of non-emitting pixels, an emitting pixel of the plurality of emitting pixels includes a light-emitting element for emitting light, and a non-emitting pixel of the plurality of non-emitting pixels includes a pseudo-light-emitting element that is not capable of emitting light.

The non-emitting pixel may include: a transistor; a pixel electrode electrically connected to the transistor; a first insulating layer disposed on the pixel electrode; and a common electrode disposed on the first insulating layer, and an entire upper surface of the pixel electrode is covered by the first insulating layer.

The non-emitting pixel may include: a transistor; a first insulating layer disposed on the transistor; a second insulating layer disposed on the first insulating layer and including an opening; an emission layer disposed in the opening; and a common electrode disposed on the emission layer, wherein an entire lower surface of the emission layer may contact an upper surface of the first insulating layer.

The non-emitting pixel may include: a transistor; a pixel electrode electrically connected to the transistor; a first insulating layer having an opening overlapping the pixel electrode; and a common electrode disposed on the pixel electrode, wherein, in the opening, an upper surface of the pixel electrode may contact the common electrode.

The non-emitting pixel may include: a plurality of transistors; a first insulating layer disposed on the transistors; a pixel electrode disposed on the first insulating layer; an emission layer disposed on the pixel electrode; and a common electrode disposed on the emission layer, and the pixel electrode is not electrically connected to the transistors.

The non-emitting pixel may include: a transistor; a pixel electrode electrically connected to the transistor; and an emission layer disposed on the pixel electrode, wherein an upper surface of the emission layer may not be electrically connected to any electrodes.

Yet another embodiment of the present disclosure provides a display panel including: a display area including a plurality of emitting pixels, and a non-display area adjacent to the display area and including a plurality of non-emitting pixels, wherein an emitting pixel of the plurality of emitting pixels and a non-emitting pixel of the plurality of non-emitting pixels respectively include a substrate; a transistor disposed on the substrate; a common electrode disposed on the transistor; and a first layer for contacting an upper surface of the common electrode, wherein a configuration between the substrate and the first layer in the emitting pixel is different from a configuration between the substrate and the first layer in the non-emitting pixel.

The emitting pixel may include: a first pixel electrode electrically connected to the transistor; and a first emission layer contacting an upper surface of the first pixel electrode and a lower surface of the common electrode, the non-emitting pixel may include: a second pixel electrode electrically connected to the transistor; and an entire upper side of the second pixel electrode may be covered by an insulating layer.

The emitting pixel may include: a first pixel electrode electrically connected to the transistor; and a first emission layer contacting an upper surface of the first pixel electrode and a lower surface of the common electrode, the non-emitting pixel may include: a second emission layer contacting a lower surface of the common electrode; and a lower surface of the second emission layer may not be electrically connected to any conductor.

The emitting pixel may include: a first pixel electrode electrically connected to the transistor; and a first emission layer contacting an upper surface of the first pixel electrode and a lower surface of the common electrode, and the non-emitting pixel may not include any emission layer.

According to the exemplary embodiments of the present disclosure, the display panel may have a display area in a non-quadrangular shape.

DETAILED DESCRIPTION OF THE EMBODIMENTS

Figure 1:
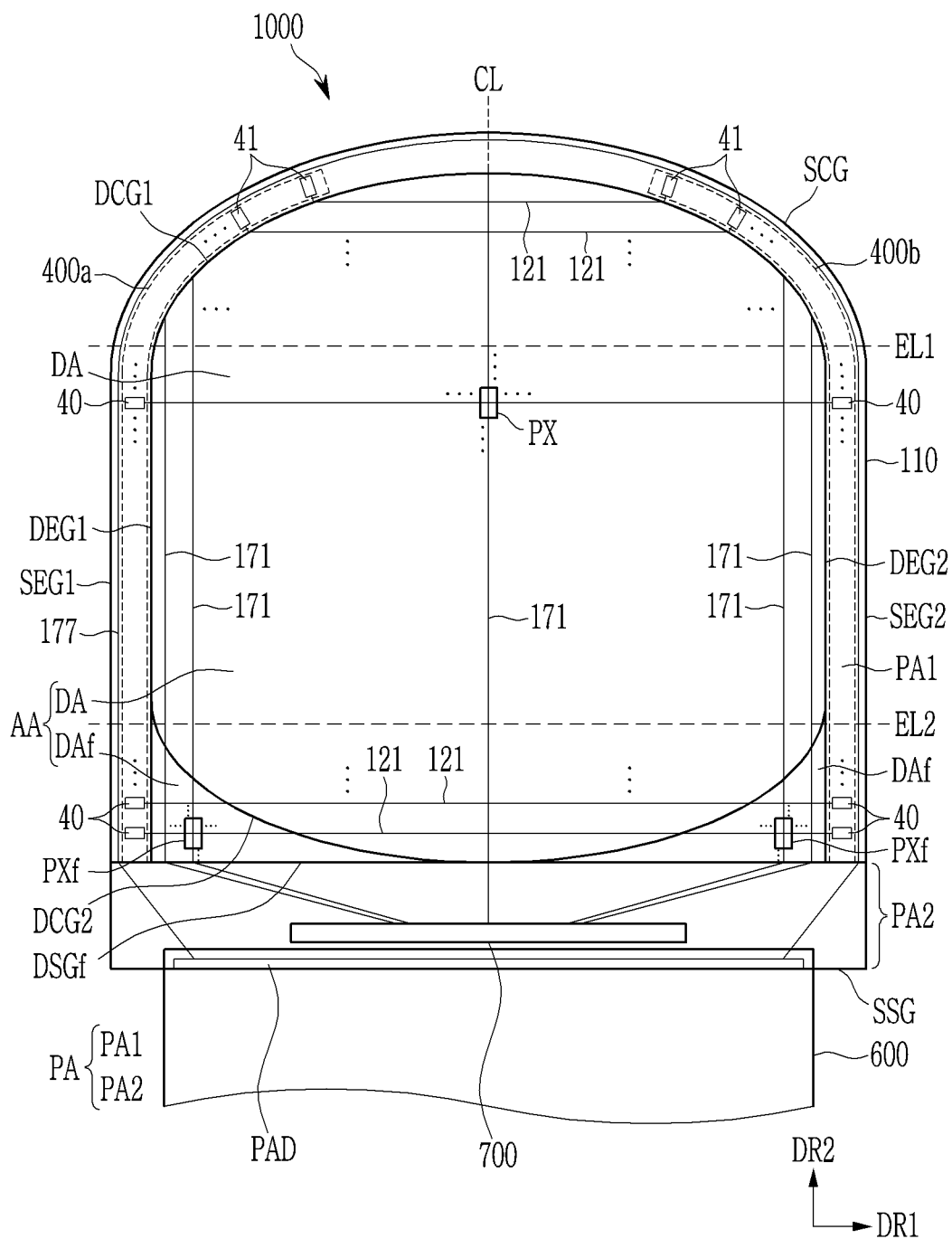
FIG. 1 shows a layout view of a display panel according to an exemplary embodiment.

The present disclosure will be described more fully hereinafter with reference to the accompanying drawings, in which exemplary embodiments of the present disclosure are shown. As those skilled in the art would realize, the described embodiments may be modified in various ways, without departing from the spirit or scope of the present disclosure.

The drawings and description are to be regarded as illustrative in nature and not restrictive, and like reference numerals designate like elements throughout the specification.

The size and thickness of each configuration shown in the drawings are arbitrarily shown for better understanding and ease of description and illustration, and the present disclosure is not limited thereto. In the drawings, the thickness of layers, films, panels, regions, etc., may be illustrated as being exaggerated for clarity. For better understanding and ease of description and illustration, the thicknesses of some layers and areas may be exaggerated.

It will be understood that when an element such as a layer, film, region, or substrate is referred to as being "on" another element, it can be directly on the other element or one or more intervening elements may also be present. In contrast, when an element is referred to as being "directly on" another element, there may be no intervening elements present. The word "on" or "above" means positioned on or below an object portion, and does not necessarily mean positioned on an upper side of the object portion based on a gravitational direction.

Unless explicitly described to the contrary, the word "comprise" and variations such as "comprises" or "comprising" will be understood to imply the inclusion of stated elements but not the exclusion of any other elements.

Throughout the specification, a plane view represents a view for observing a side that is defined by two directions (e.g., a first direction DR1 and a second direction DR2) crossing each other, and a cross-sectional view represents a view for observing a side that is cut in a direction (e.g., a third direction DR3) that is perpendicular to a side that is parallel to the first direction DR1 and the second direction DR2. Further, when two constituent elements overlap each other, it means that the two constituent elements overlap each other in the third direction DR3, for example, in the direction that is perpendicular to an upper surface of a substrate.

A display panel according to an exemplary embodiment will now be described with reference to FIG. 1 to FIG. 7.

Figure 2:
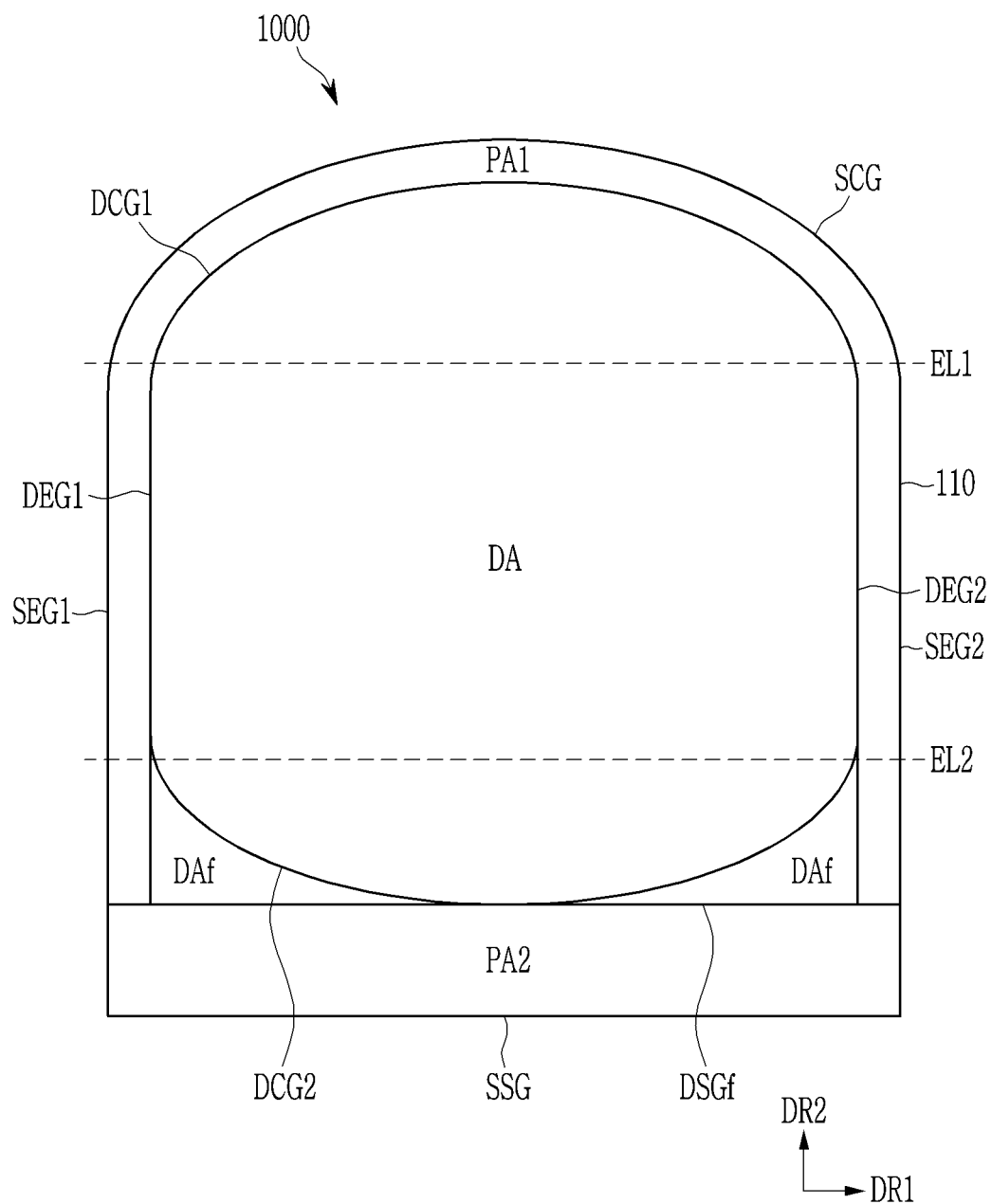
FIG. 2 shows a layout view of regions of a display panel shown in FIG. 1.

Referring to FIG. 1 and FIG. 2, a display panel 1000 according to an exemplary embodiment may include a substrate 110. The substrate 110 may include an insulating material such as glass or plastic. The substrate 110 may be flexible, and it may be a rigid substrate that has a substantially fixed shape.

The substrate 110 of the display panel 1000 includes an active area AA, and a peripheral area PA adjacent to the active area AA. The active area AA includes a display area DA and at least one non-display area DAf. The at least one non-display area DAf may be adjacent to the display area DA.

A plurality of signal lines 121 and 171 are disposed in the active area AA. A plurality of pixels PX are disposed in the display area DA of the active area AA, and a plurality of pseudo-pixels PXf are disposed in the non-display area DAf. The pixels PX may be referred to as emitting pixels, and the pseudo-pixels PXf may be referred to as non-emitting pixels.

The signal lines 121 and 171 may include a plurality of gate lines 121 for transmitting gate signals, and a plurality of data lines 171 for transmitting data signals. In the active area AA, a switching element connected to a gate line 121 and a data line 171 may be turned on or turned off by the gate signal, and the turned-on switching element may transmit the data signal transmitted by the data line 171 to the electrode connected to the switching element. The gate line 121 extend substantially in the first direction DR1, and the data line 171 may cross a plurality of gate lines 121 and may extend substantially in the second direction DR2.

The display area DA may display an image on a side that is defined by the first direction DR1 and the second direction DR2. Each pixel PX disposed in the display area DA may include at least one switching element and one light-emitting element connected thereto. The switching element may be a three-terminal element such as a transistor integrated on the display panel 1000, and may be electrically connected to at least one gate line 121 and one data line 171. When the display device displays an image, the pixels PX disposed in the display area DA may output light so that a user may observe the image displayed in the display area DA.

A boundary of the display area DA may have a closed loop form and it may configure a non-quadrangular form (e.g., a quadrangular form). For example, the boundary of the display area DA may include at least one curved edge DCG1 and DCG2.

Referring to FIG. 1 and FIG. 2, the two curved edges DCG1 and DCG2 may form two boundaries that are disposed at an upper portion and a lower portion of the display area DA and face each other.

As shown in FIG. 1 and FIG. 2, the curved edges DCG1 and DCG2 may be curved, and differing from this, at least one of the curved edges DCG1 and DCG2 may be a step type and may include at least one bent portion. At least one of the curved edges DCG1 and DCG2 is bent stepwise, and the curved edges DCG1 and DCG2 may include a plurality of lines extending in the first direction DR1 or the second direction DR2.

Figure 4:
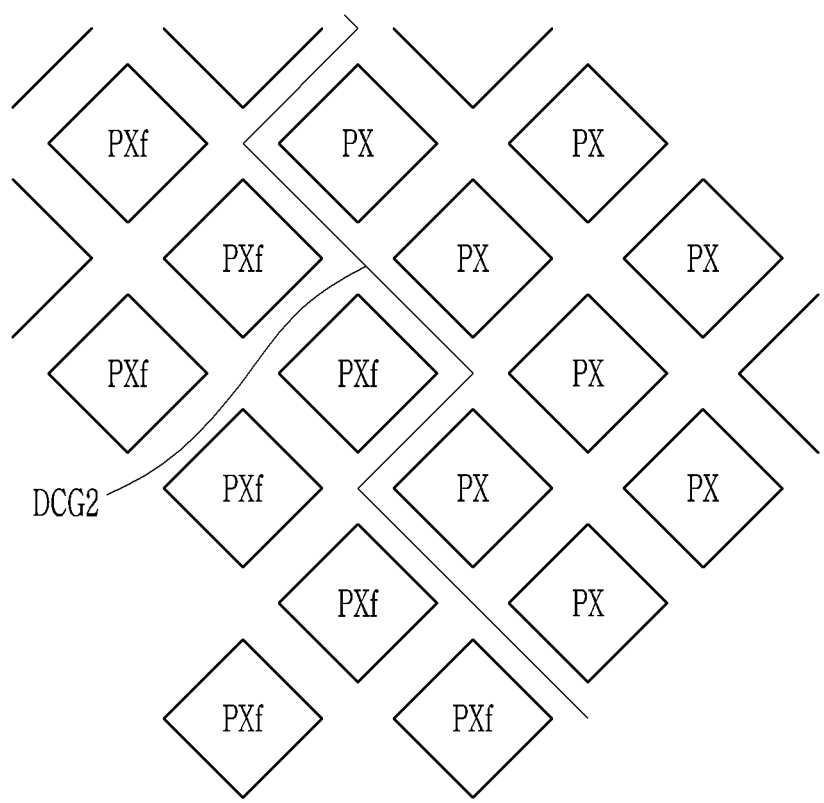
FIG. 4 shows a boundary between a display area of a display panel and a non-display area according to an exemplary embodiment.

When the curved edge DCG2 is bent stepwise, as shown in FIG. 4, the curved edge DCG2 may correspond to a boundary passing between the pseudo-pixels PXf of the non-display area DAf and the pixels PX of the display area DA. Accordingly, the curved edge DCG2 may not overlap a plurality of pixels PX and a plurality of pseudo-pixels PXf in a plan view. When a resolution of the display panel 1000 is high enough, the curved edges DCG1 and DCG2 may be recognized as curves.

Referring to FIG. 1, the boundary of the display area DA may further include sides DEG1 and DEG2 connecting the two curved edges DCG1 and DCG2. The two sides DEG1 and DEG2 may form side boundaries that are disposed on the left side and the right side of the display area DA and face each other, and they may be linear sides extending in parallel to the second direction DR2.

Here, left and right mean left and right side with respect to a virtual center line CL of the display panel 1000 according to an exemplary embodiment, which will be identically applied hereinafter. Further, for ease of description, a virtual horizontal line EL1 passing the boundary between the curved edge DCG1 on the upper side and the sides DEG1 and DEG2 and a virtual horizontal line EL2 passing through the boundary between the curved edge DCG2 on the lower side and the sides DEG1 and DEG2 are shown. Hereinafter, the upper side may mean an upper portion with respect to the horizontal line EL1, and the lower side may mean a lower portion with respect to the horizontal line EL2.

Differing from FIG. 1 and FIG. 2, the boundary of the display area DA may not include a linear side, and may form a circle or an oval. This may be realized by reducing a ratio by which the sides DEG1 and DEG2 shown in FIG. 1 and FIG. 2 occupy the side boundary of the display area DA.

The non-display area DAf does not display an image, differing from the display area DA. In detail, when the display device displays an image, the display area DA emits light, but the pseudo-pixels PXf disposed in the non-display area DAf do not emit light, so they may be recognized as a non-display area. The non-display area DAf may have almost the same configuration as the display area DA, and may have a configuration that does not display images. In a like manner, the pseudo-pixel PXf may have almost the same configuration as the pixel PX, and may have a configuration that is not capable of emitting light. That is, the pixel PX may receive a data voltage and may emit light, and the pseudo-pixel PXf may have a configuration that emits no light. A detailed configuration thereof will be described in the latter portion of the present specification.

An arranged form of the pseudo-pixels PXf disposed in the non-display area DAf may substantially correspond to an arranged form of the pixels PX disposed in the display area DA. For example, a pitch between the pseudo-pixels PXf disposed in the non-display area DAf or a size of the pseudo-pixel PXf may substantially correspond to a pitch between the pixels PX disposed in the display area DA or a size of the pixel PX.

As described above, at least one non-display area DAf may be disposed near the display area DA, and particularly, it may be adjacent to the at least one curved edge DCG2 included in the display area DA. Referring to FIG. 1 and FIG. 2, the non-display area DAf on the left is adjacent to the left portion of the curved edge DCG2 on the lower portion of the display area DA, and the non-display area DAf on the right side may be adjacent to the right portion of the curved edge DCG2 on the lower portion of the display area DA. Accordingly, the boundary between the non-display area DAf and the display area DA may correspond to the curved edge DCG2 of the display area DA.

The curved edge DCG2 that is a boundary between the non-display area DAf and the display area DA may not be an actual boundary of an additional constituent element or an additional layer. As described above, the curved edge DCG2 may correspond to a boundary passing between the pseudo-pixels PXf of the non-display area DAf and the pixels PX of the display area DA. The boundary between the pseudo-pixels PXf of the non-display area DAf and the pixels PX of the display area DA may be distinguished by a region in which an image is displayed and a region in which an image is not displayed when the display panel 1000 displays the image. In some embodiments, the boundary between the pseudo-pixels PXf of the non-display area DAf and the pixels PX of the display area DA may be distinguished between the pseudo-pixels PXf that may not emit light and the pixels PX that may emit light when the display panel 1000 does not display an image.

A boundary that is not adjacent to the display area DA among the boundary of the non-display area DAf may include a side DSGf. The side DSGf may be a linear side extending in parallel to the first direction DR1. The side DSGf may be included on the lower boundary of the active area AA. As an exemplary embodiment, as shown in FIG. 1 and FIG. 2, a portion of the side DSGf may be tangential to the curved edge DCG2 of the lower side of the display area DA.

An entire plane of the active area AA including the display area DA and the non-display area DAf may have a non-rectangular shape surrounded by the curved edge DCG1 on the upper portion, the sides DEG1 and DEG2 on the left and right sides, and the side DSGf on the lower portion. For ease of description, the curved edge DCG1 of the display area DA will also be referred to as a curved edge DCG1 of the active area AA, the sides DEG1 and DEG2 of the display area DA will also be referred to as sides DEG1 and DEG2 of the active area AA, and the side DSGf of the non-display area DAf will also be referred to as a side DSGf of the active area AA.

Particularly, in the present exemplary embodiment, the boundary between the display area DA and the non-display area DAf adjacent to each other may form a curved edge DCG2, and at least one gate line 121 may extend cross the curved edge DCG2 that may form a boundary between the display area DA and the non-display area DAf. That is, the gate line 121 crossing the curved edge DCG2 that forms a boundary between the display area DA and the non-display area DAf may pass through the non-display area DAf on the left side, may cross the curved edge DCG2 on the left side, may pass through the display area DA, may cross the curved edge DCG2 on the right side, and may pass through the non-display area DAf on the right side.

The peripheral area PA may include a first peripheral area PA1 adjacent to the boundaries on the left side, the right side, and the upper side among the boundaries of the active area AA and a second peripheral area PA2 adjacent to the boundary of the lower side.

The first peripheral area PA1 may extend along the boundary of the active area AA. For example, the first peripheral area PA1 may include a pair of linear portions extending along the side DEG1 on the left side of the active area AA and the side DEG2 on the right side, and a curve portion extending along the curved edge DCG1 on the upper side of the active area AA.

Referring to FIG. 1 and FIG. 2, the first peripheral area PA1 may include a region disposed up to the boundary of the substrate 110 from boundaries on the upper side, the left side, and the right side of the active area AA. The boundary adjacent to the first peripheral area PA1 among the boundaries of the substrate 110 may include sides SEG1 and SEG2 extending in parallel to the sides DEG1 and DEG2 of the active area AA, and a curved edge SCG extending in parallel to the curved edge DCG1 on the upper side of the active area AA.

The curved edge SCG may substantially have a round curve form. The curved edge SCG may be connected to the sides SEG1 and SEG2 between the sides SEG1 and SEG2. The sides SEG1 and SEG2 may be linear sides. Because the boundary of the substrate 110 is the boundary of the display panel 1000, the sides SEG1 and SEG2 and the curved edge SCG on the boundary of the substrate 110 may correspond to sides SEG1 and SEG2 and a curved edge SCG on the boundary of the display panel 1000.

The second peripheral area PA2 may be disposed in the lower portion of the non-display area DAf. The second peripheral area PA2 may correspond to a region up to the boundary of the substrate 110 from the lower boundary of the active area AA. The boundary adjacent to the second peripheral area PA2 among the boundaries of the substrate 110 may include a side SSG extending in parallel with the non-display area DAf or the side DSGf on the lower side of the active area AA, and sides SEG1 and SEG2 extending from the first peripheral area PA1. The side SSG may be a linear side. A corner where the side SSG on the lower side of the substrate 110 meets the sides SEG1 and SEG2 on the left side and the right side may be pointed as shown in FIG. 1 and FIG. 2. In other embodiments, the corner may be cut in an oblique manner or may form a round curve.

Gate drivers 400*a* and 400*b* may be disposed on the left side and the right side in the first peripheral area PA1, respectively.

The gate drivers 400*a* and 400*b* may be connected to gate lines 121 disposed in the active area AA to transmit a gate signal. The gate drivers 400*a* and 400*b* may respectively include a plurality of stages 40 and 41 sequentially connected to each other. The stages 40 and 41 may be respectively connected to the corresponding gate lines 121. The gate drivers 400*a* and 400*b* including the stages 40 and 41 may be formed on the substrate 110 together with a plurality of signal lines 121 and 171 and switching elements that are disposed in the active area AA.

The stages 40 and 41 may respectively include a plurality of transistors and at least one capacitor for generating a gate signal, and the region where the plurality of transistors and the capacitor are densely formed may have a planar shape that is elongated in one direction.

Among the stages 40 and 41, the stage 40 disposed between the sides DEG1 and DEG2 of the active area AA and the sides SEG1 and SEG2 of the substrate 110 may be substantially elongated in parallel to the first direction DR1. On the contrary, the stage 41 disposed between the curved edge DCG1 of the active area AA and the curved edge SCG of the substrate 110 may be substantially elongated in a direction that is different from the first direction DR1 and the second direction DR2.

The stages 40 disposed on the left side and the right side in the first peripheral area PA1 may have substantially the same form and may be substantially arranged in the second direction DR2, and the stages 41 disposed on the upper side with respect to the horizontal line EL1 in the first peripheral area PA1 may be disposed in a form that is different from the stages 40. In detail, the stages 41 may be disposed in a gradually rotated manner along the curved edge DCG1. For example, the direction in which the stages 40 and 41 are elongated may be substantially parallel to the perpendicular line to the boundary of the active area AA.

One of the gate drivers 400*a* and 400*b* disposed on the left or the right side may be omitted.

A driving circuit portion 700 and a pad portion PAD may be disposed in the second peripheral area PA2.

The driving circuit portion 700 may output a driving signal for driving the display panel 1000 to the first peripheral area PA1 and the active area AA. The driving circuit portion 700 may include a driving circuit chip bonded and connected to the display panel 1000. The data lines 171 may extend toward the second peripheral area PA2 and may be connected to the driving circuit portion 700, and may receive a data signal from the driving circuit portion 700.

The pad portion PAD may be adjacent to the lower boundary of the display panel 1000. The pad portion PAD may include a plurality of pads for electrical connection with a circuit board such as a flexible printed circuit (FPC) board.

The display device according to an exemplary embodiment may further include a circuit board 600 electrically connected to the pad portion PAD of the display panel 1000. The circuit board 600 may be a flexible film type.

The display panel 1000 may further include a voltage transmitting line 177 disposed in the peripheral area PA. The voltage transmitting line 177 may include a portion extending along the boundary of the active area AA in the first peripheral area PA1, and a portion disposed in the second peripheral area PA2 and connected to the pad portion PAD. The voltage transmitting line 177 may transmit a constant voltage such as a common voltage (ELVSS) to the active area AA.

A boundary (e.g., a side SSG) on the lower side of the substrate 110 may not be bent unlike the curved edge SCG of the boundary on the upper side, and the circuit board 600 for transmitting a driving signal to the display device according to an exemplary embodiment may be connected to the lower portion of the display panel 1000. That is, the boundaries of the display panel 1000 and the substrate 110 may be asymmetric from top to bottom. A plurality of wires connected to the circuit board 600 may be disposed in the second peripheral area PA2 of the substrate 110.

Referring to FIG. 1 and FIG. 2, the non-display areas DAf disposed on the left side and the right side of the display panel 1000 may be substantially separated from each other. The sides DSGf on the lower sides of the non-display areas DAf may substantially form a single continuous line.

Figure 3A:
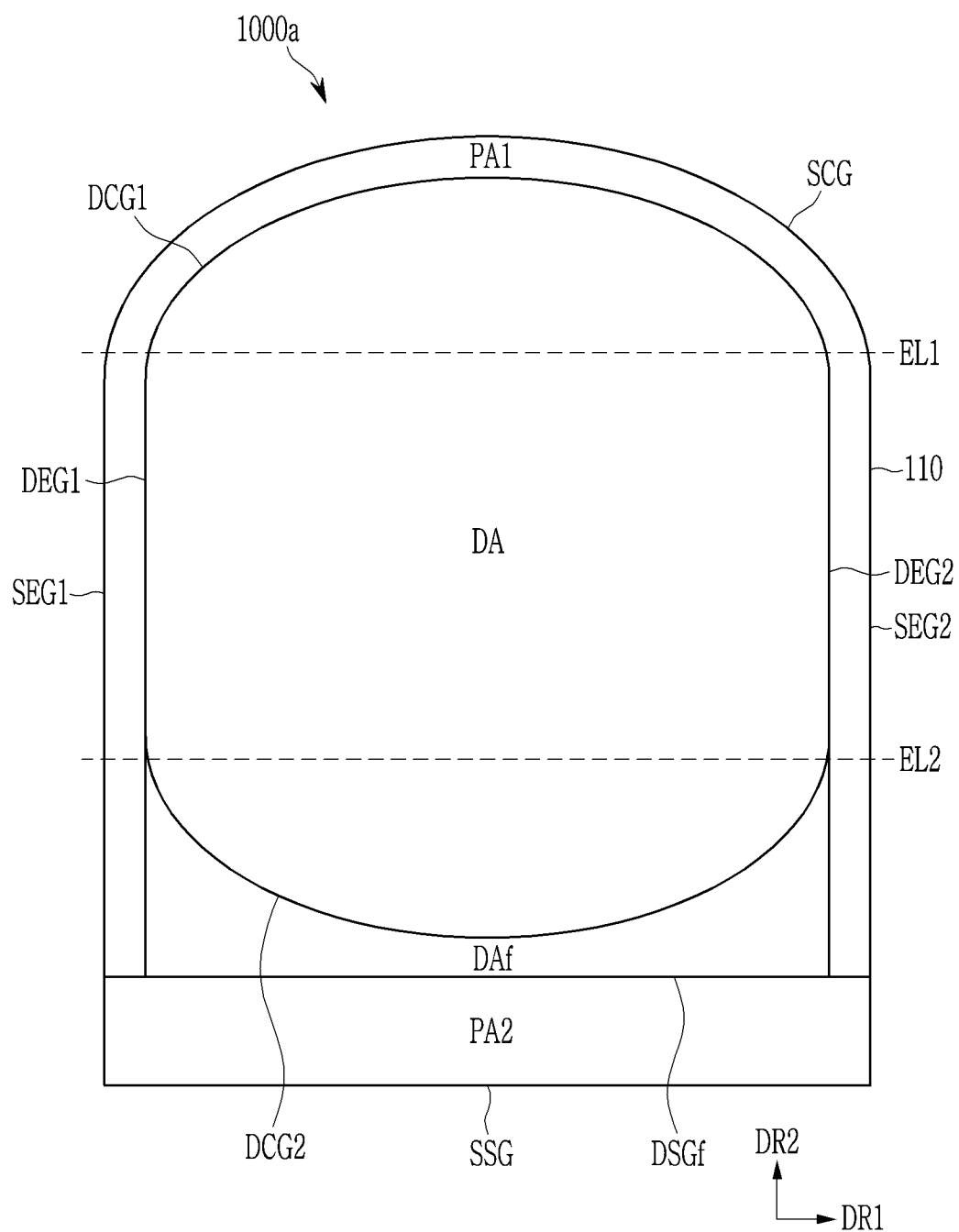
FIG. 3A and FIG. 3B respectively show a layout view of regions of a display panel according to an exemplary embodiment.

Referring to FIG. 3A, the non-display areas DAf disposed on the left side and the right side of a display panel 1000a mostly corresponding to the non-display area DAf of the above-described display panel 1000 may be connected to each other to form a continuous non-display area DAf. In this case, the side DSGf on the lower side of the non-display area DAf may be separated from the curved edge DCG2 on the lower side of the display area DA.

Figure 3B:
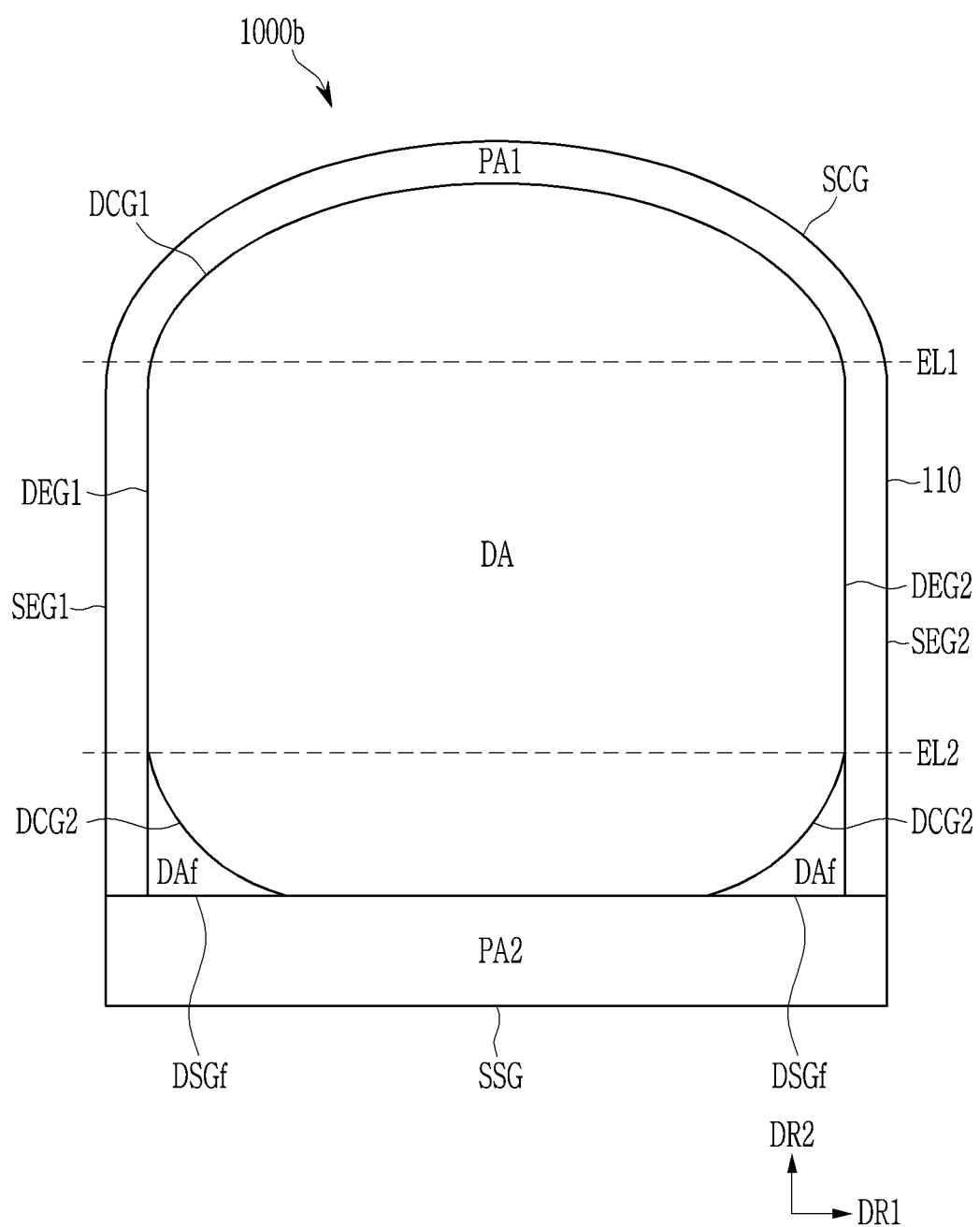

Referring to FIG. 3B, the non-display areas DAf disposed on the left side and the right side of the display panel 1000b mostly corresponding to the non-display area DAf of the display panel 1000 may be separated from each other in the first direction DR1, and the respective sides DSGf of the non-display areas DAf may be separated from each other. In this case, the sides DSGf may not contact the curved edge DCG2 on the lower side of the display area DA.

The display panels 1000, 1000a, and 1000b according to the exemplary embodiments may include a plurality of layers that are disposed on the substrate 110 and patterned thereon. A plane structure and a cross-sectional structure of the layers will now be described with reference to FIG. 5 and FIG. 6.

A barrier layer 120 may be disposed on the substrate 110. As shown, the barrier layer 120 may include a plurality of layers, or it may be formed with a single layer.

An active pattern 130 is disposed on the barrier layer 120. The active pattern 130 may include channel regions 131a, 131b, 131c_1, 131c_2, 131d_1, 131d_2, 131e, 131f, and 131g for forming respective channels of a plurality of transistors T1, T2, T3_1, T3_2, T4_1, T4_2, T5, T6, and T7 included in one pixel PX. In addition, the active pattern 130 may include a conductive region including source regions 136a, 136b, 136c_1, 136c_2, 136d_1, 136d_2, 136e, 136f, and 136g and drain regions 137a, 137b, 137c_1, 137c_2, 137d_1, 137d_2, 137e, 137f, and 137g that are disposed on respective sides of the channel regions 131a, 131b, 131c_1, 131c_2, 131d_1, 131d_2, 131e, 131f, and 131g of the transistors T1, T2, T3_1, T3_2, T4_1, T4_2, T5, T6, and T7.

The active pattern 130 may include amorphous silicon, polysilicon, or an oxide semiconductor.

A first insulating layer 141 may be disposed on the active pattern 130, and a first conductive layer may be disposed on the first insulating layer 141. The first conductive layer may include a plurality of scan lines 151, 152, and 154, a control line 153, and a driving gate electrode 155a. The scan line 154 is substantially the same as the scan line 152, and it may transmit a scan signal that is on the next stage after the scan signal transmitted by the scan line 152. A plurality of scan lines 151, 152, and 154 and a control line 153 may be included in the above-described gate line 121.

The active pattern 130 and the plurality of scan lines 151, 152, and 154 and the control line 153 overlapping the same may form the plurality of transistors T1, T2, T3_1, T3_2, T4_1, T4_2, T5, T6, and T7. The first transistor T1 includes the channel region 131a, the source region 136a, and the drain region 137a, and the driving gate electrode 155a overlapping the channel region 131a in a plane view. The second transistor T2 includes the channel region 131b, the source region 136b, and the drain region 137b, and the gate electrode 155b that is a part of the scan line 151 overlapping the channel region 131b in a plane view. The third transistors T3_1 and T3_2 may include sub-transistors T3_1 and T3_2 that are connected to each other. The sub-transistor T3_1 includes the channel region 131c_1, the source region 136c_1, and the drain region 137c_1, and the gate electrode 155c_1 that is a part of the scan line 151 overlapping the channel region 131c_1. The sub-transistor T3_2 includes the channel region 131c_2, the source region 136c_2, and the drain region 137c_2, and the gate electrode 155c_2 that is a part of the scan line 151 overlapping the channel region 131c_2. The fourth transistors T4_1 and T4_2 may include sub-transistors T4_1 and T4_2 that are connected to each other. The sub-transistor T4_1 includes the channel region 131d_1, the source region 136d_1, and the drain region 137d_1, and the gate electrode 155d_1 that is a part of the scan line 152 overlapping the channel region 131d_1. The sub-transistor T4_2 includes the channel region 131d_2, the source region 136d_2, and the drain region 137d_2, and the gate electrode 155d_2 that is a part of the scan line 152 overlapping the channel region 131d_2. The fifth transistor T5 includes the channel region 131e, the source region 136e, and the drain region 137e, and the gate electrode 155e that is a part of the control line 153 overlapping the channel region 131e. The sixth transistor T6 includes the channel region 131f, the source region 136f, and the drain region 137f, and the gate electrode 155f that is a part of the control line 153 overlapping the channel region 131f. The seventh transistor T7 includes the channel region 131g, the source region 136g, and the drain region 137g, and the gate electrode 155g that is a part of the scan line 154 overlapping the channel region 131g.

A second insulating layer 142 may be disposed on the first conductive layer and the first insulating layer 141, and a second conductive layer may be disposed on the second insulating layer 142. The second conductive layer may include a storage line 156 and an initialization voltage line 159 for transmitting an initialization voltage. The storage line 156 may include an extension 157 that is disposed in the pixel PX. A portion of the extension 157 may be removed to form an opening 51.

A third insulating layer 160 may be disposed on the second conductive layer and the second insulating layer 142.

At least one of the barrier layer 120, the first insulating layer 141, the second insulating layer 142, and the third insulating layer 160 may include an inorganic insulating material and/or an organic insulating material such as a silicon nitride (SiNx), a silicon oxide (SiOx), or a silicon oxynitride (SiON). Some or all of the first insulating layer 141, the second insulating layer 142, and the third insulating layer 160 may have a plurality of contact holes 61, 62, 63, 64, 65, 67, 68, and 69.

A third conductive layer may be disposed on the third insulating layer 160. The third conductive layer may include the above-described voltage transmitting line 177 and the data line 171, a driving voltage line 172, and a plurality of connecting members 174, 175, and 179. The data line 171 and the driving voltage line 172 may substantially extend in the second direction DR2 and may cross the plurality of scan lines 151, 152, and 154.

A first portion of the connecting member 174 may be connected to the driving gate electrode 155a through the opening 51 of the extension 157 of the storage line 156 and the contact hole 61 in the opening 51, and a second portion of the connecting member 174 may be connected to the drain region 137c_1 of the sub-transistor T3_1 of the third transistor T3 and the drain region 137d_1 of the sub-transistor T4_1 of the fourth transistor T4 through the contact hole 63. The connecting member 175 may be connected to the initialization voltage line 159 through the contact hole 64 and may be connected to the drain region 137g of the seventh transistor T7 through the contact hole 65. The connecting member 179 may be connected to the drain region 137f of the sixth transistor T6 through the contact hole 69. The data line 171 may be connected to the source region 136b of the second transistor T2 through the contact hole 62, and the driving voltage line 172 may be connected to the source region 136e of the fifth transistor T5 through the contact hole 67 and to the extension 157 of the storage line 156 through the contact hole 68. Therefore, the extension 157 of the storage line 156 may receive the driving voltage (ELVDD) of the driving voltage line 172.

At least one of the first conductive layer, the second conductive layer, and the third conductive layer may include a conductive material such as copper (Cu), silver (Ag), aluminum (Al), molybdenum (Mo), titanium (Ti), tantalum (Ta), and an alloy of at least two of them.

The driving gate electrode 155a and the extension 157 of the storage line 156 overlapping each other with the second insulating layer 142 therebetween may form a capacitor Cst.

A passivation layer 180 that is a fourth insulating layer is disposed on the third conductive layer and the third insulating layer 160. The passivation layer 180 may have a contact hole 89 disposed on the connecting member 179. The passivation layer 180 may include an inorganic insulating material and/or an organic insulating material such as a polyacryl-based resin or a polyimide-based resin.

A pixel electrode layer is disposed on the passivation layer 180. The pixel electrode layer may include a pixel electrode 191. The pixel electrode 191 may be connected to the connecting member 179 through the contact hole 89 to receive a data voltage. The pixel electrode layer may further include a pixel conducting pattern 192. The pixel conducting pattern 192 may be curved along the boundary of the pixel electrode 191. The pixel conducting pattern 192 may transmit the initialization voltage. In some embodiments, the pixel conducting pattern 192 may be omitted. The pixel electrode layer may include a semi-transmitting conductive material or a reflective conductive material.

A pixel defining layer 350 that is a fifth insulating layer is disposed on the passivation layer 180 and the pixel electrode layer. A portion of the pixel defining layer 350 disposed on the pixel electrode 191 may be removed to form an opening 351 overlapping the pixel electrode 191. The pixel defining layer 350 may include a photosensitive material such as a polyacryl-based resin or a polyimide-based resin. The pixel defining layer 350 may be transparent or opaque, and it may include a pigment such as carbon black.

An emission layer 370 is disposed on the pixel electrode 191. The emission layer 370 may include a portion that is disposed in the opening 351 of the pixel defining layer 350. The emission layer 370 may include an organic emitting material or an inorganic emitting material. In a plane view, a region of the opening 351 may correspond to a region where the pixel PX emits light.

A common electrode 270 is disposed on the emission layer 370. The common electrode 270 is formed on the pixel defining layer 350, and it may be continuously formed over a plurality of pixels PX. The common electrode 270 may include a conductive transparent material.

In the display area DA, the pixel electrode 191 of the pixel PX, the emission layer 370, and the common electrode 270 form a light emitting diode ED that is a light-emitting element, and one of the pixel electrode 191 and the common electrode 270 corresponds to a cathode, and the other corresponds to an anode of the light-emitting diode. The light emitting diode ED may be a self-illuminating element.

An encapsulation layer 380 may be disposed on the common electrode 270. The encapsulation layer 380 may protect the light emitting diode ED by preventing external impurities from being permeated. The encapsulation layer 380 may include at least one organic layer 382 and at least one of inorganic layers 381 and 383. The lower side of the organic layer 382 may have different heights from the substrate 110 along the surface of the inorganic layer 381, and the upper side thereof may form a flat surface.

Various configurations of a pseudo-pixel PXf disposed in the non-display area DAf of display panels 1000, 1000a, and 1000b will now be described with reference to FIG. 5, FIG. 6, and FIGS. 7 to 12.

Figure 5:
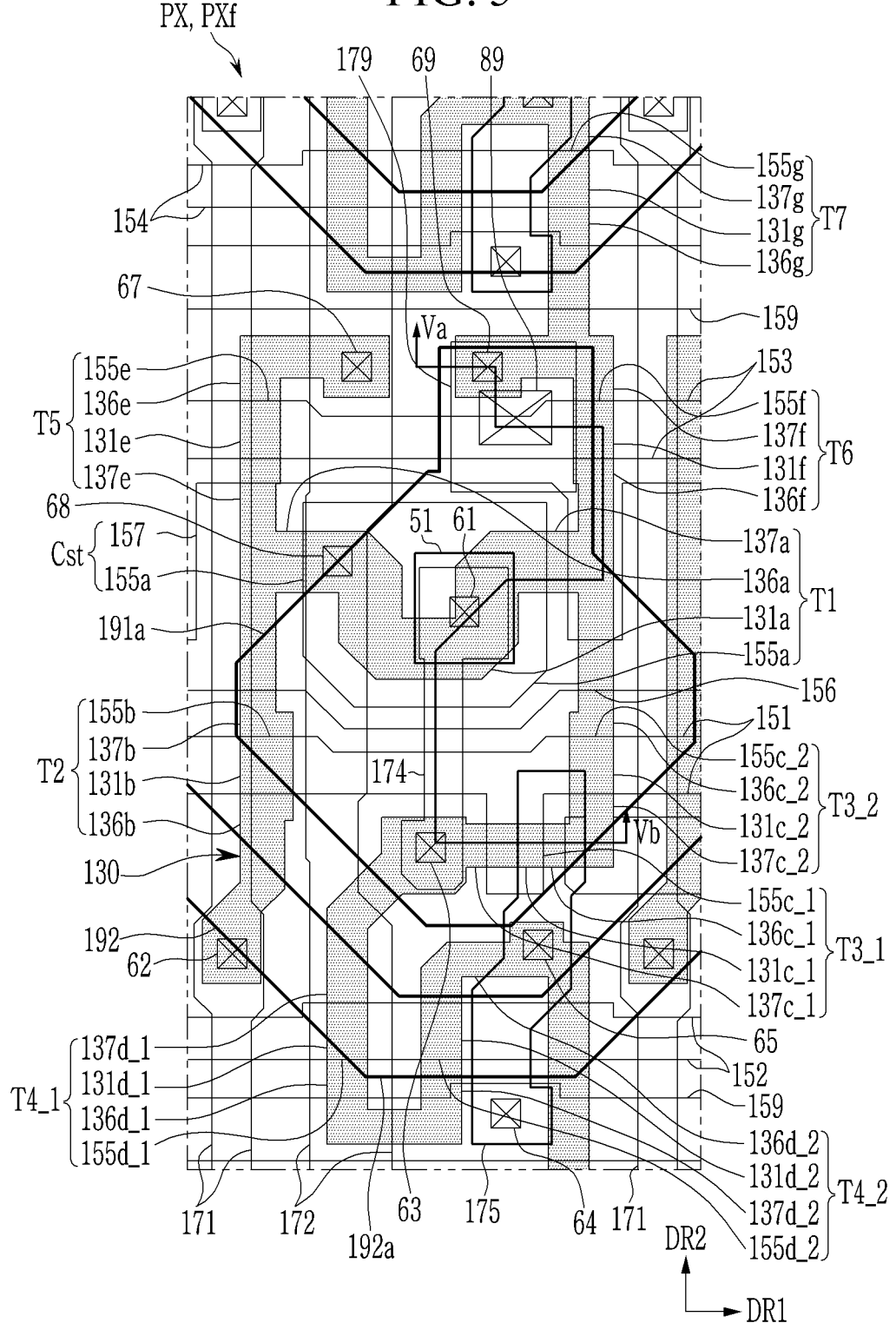
FIG. 5 shows a layout view of a pixel included in a display panel according to an exemplary embodiment.
Figure 6:
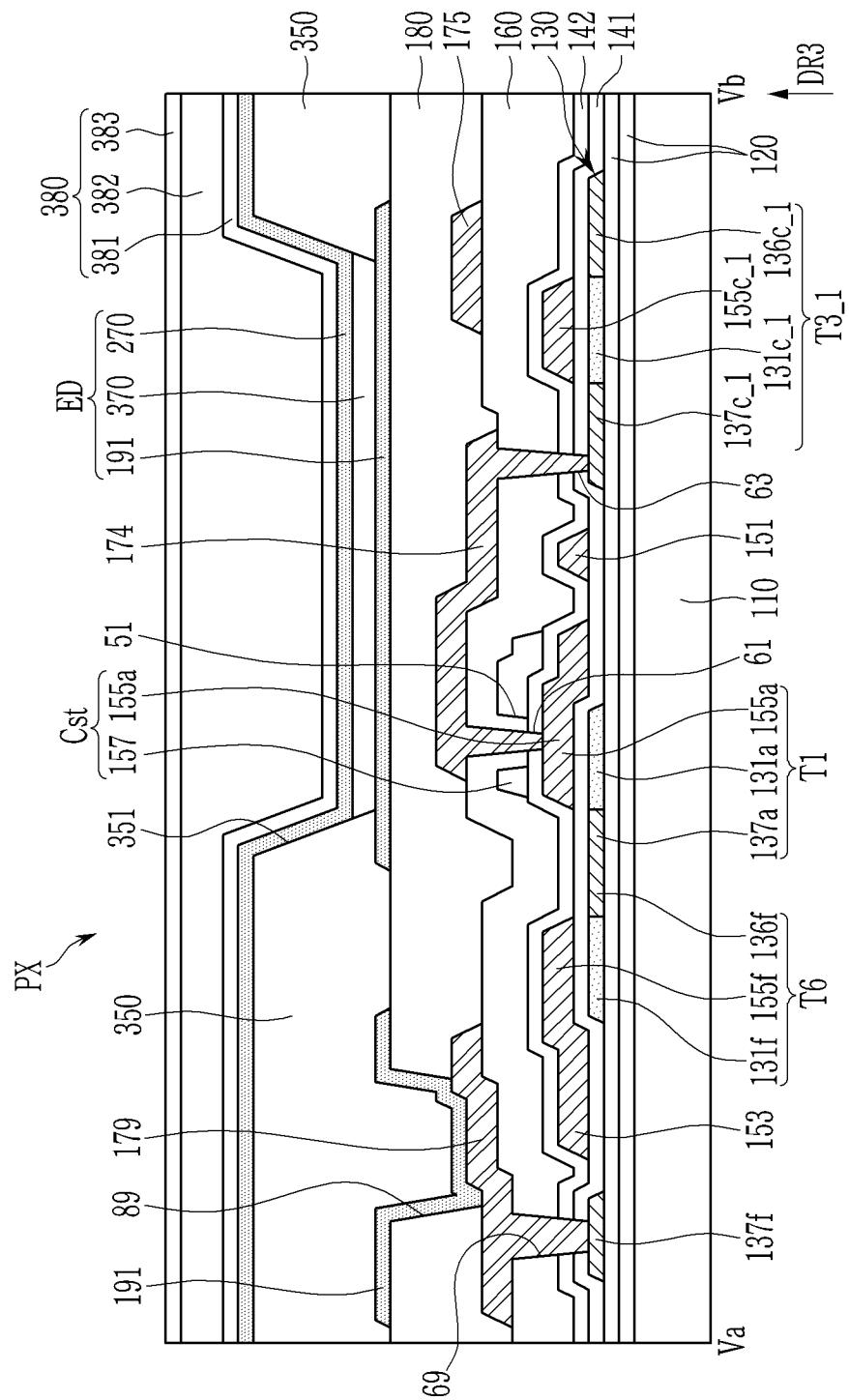
FIG. 6 shows a cross-sectional view of a display panel shown in FIG. 5 with respect to a line Va-Vb.

As described above, the pseudo-pixel PXf may have almost the same configuration as the pixel PX described with reference to FIG. 5 and FIG. 6, but it may have a configuration that cannot generate light and thus is not capable of emitting light.

In detail, the common electrode 270 of the light emitting diode ED of the pixel PX may be electrically connected to a plurality of transistors (particularly, the sixth transistor T6) included in the pixel PX to receive a voltage and apply a current to the emission layer 370. However, the pseudo-pixel PXf may not include a light emitting diode (LED) (e.g., it may not include an emission layer), or when it includes a pseudo-light emitting diode with the same configuration as the light emitting diode, it may have a configuration in which the pixel electrode 191 is not electrically connected to a plurality of transistors (particularly, the sixth transistor T6) so it may not receive a voltage, and no current is applied to the pseudo-light emitting diode, thereby not capable of emitting light.

Figure 7:
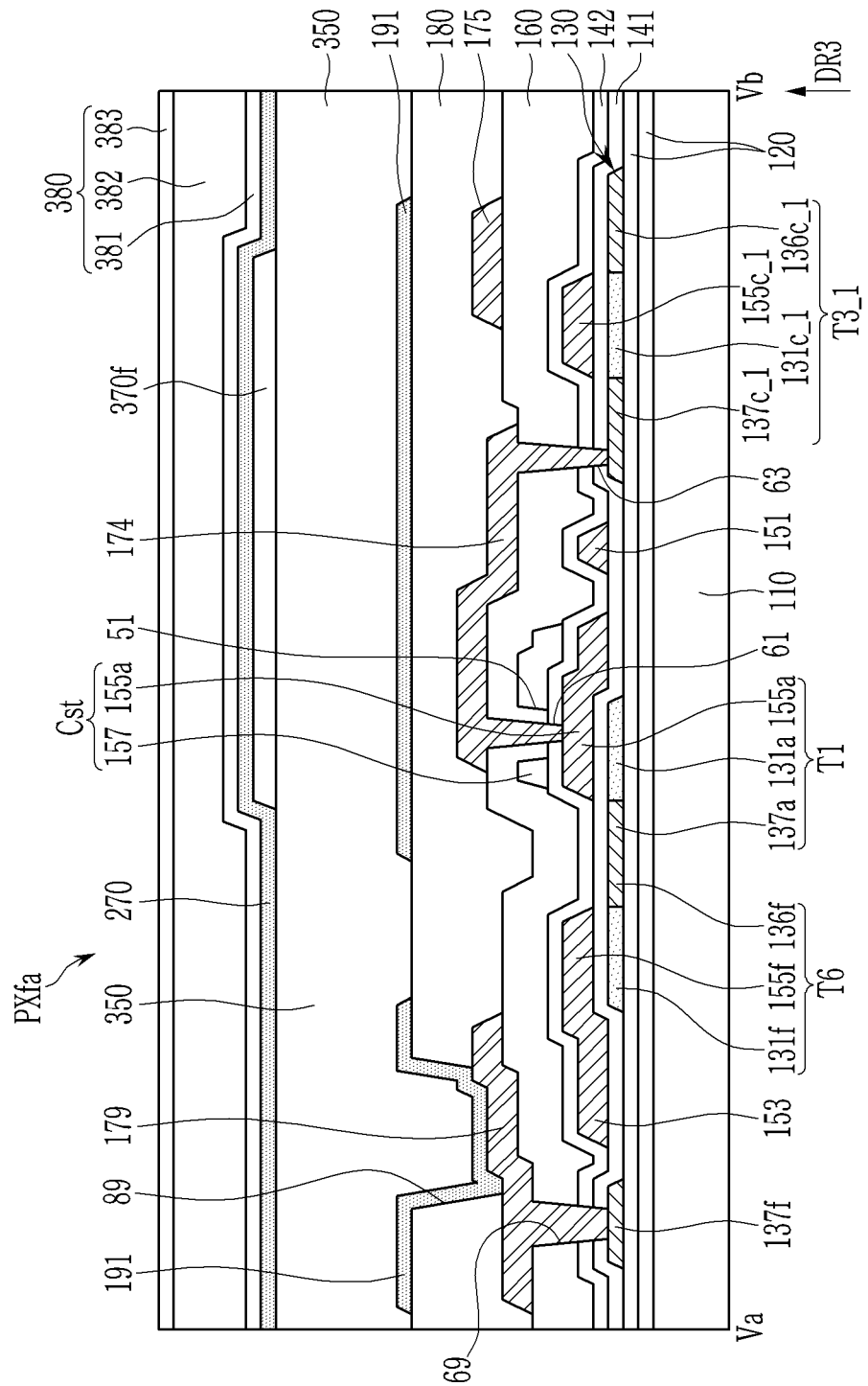
FIG. 7, FIG. 8, and FIG. 9A respectively show a cross-sectional view on a non-emitting pixel of a display panel according to an exemplary embodiment with respect to a line Va-Vb of FIG. 5.

Referring to FIG. 7, as an example of a pseudo-pixel PXf that is a non-emitting pixel, a pseudo-pixel PXfa generally has the same configuration as the pixel PX, but the pixel defining layer 350 may not include an opening 351 that is disposed on the pixel electrode 191 of the pseudo-pixel PXf. Accordingly, the entire upper surface of the pixel electrode 191 is covered by the pixel defining layer 350 and contacts the same, and when an emission layer 370f is disposed on the pixel defining layer 350, the emission layer 370f may not contact the pixel electrode 191. The emission layer 370f generally corresponds to the above-described emission layer 370, and it may be disposed on the pixel defining layer 350. Differing from this, the emission layer 370f may be omitted. Accordingly, the pixel electrode 191 and the common electrode 270 fail to form a light emitting diode in the pseudo-pixel PXfa, so the pseudo-pixel PXfa cannot emit light.

Figure 8:
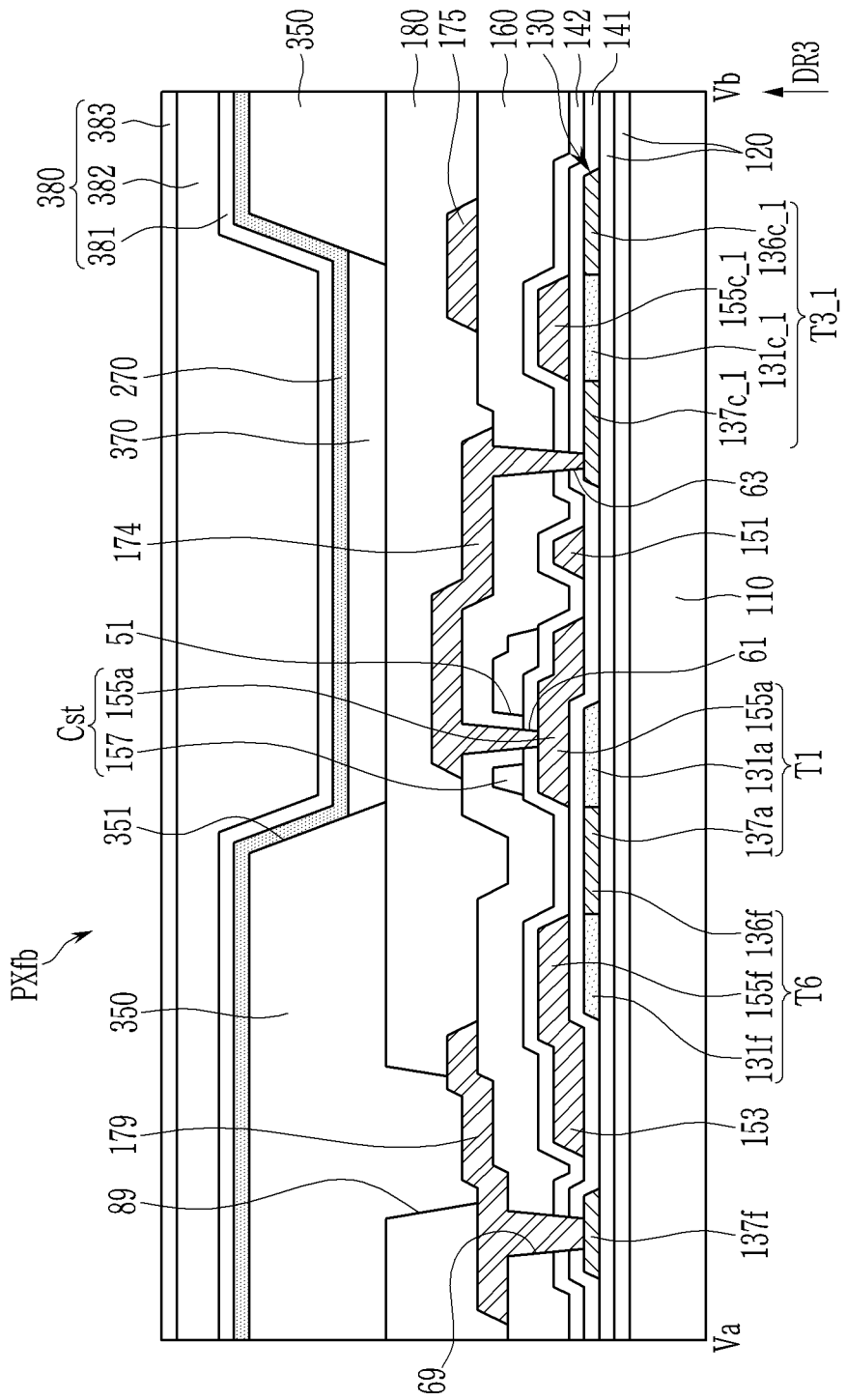

Referring to FIG. 8, as an example of the pseudo-pixel PXf, a pseudo-pixel PXfb generally has the same configuration as the pixel PX, but the pixel electrode 191 may not be formed. Therefore, when the emission layer 370 is formed, the entire bottom (or lower) surface of the emission layer 370 may not contact a conductor or an electrode and may contact the upper surface of the passivation layer 180. Accordingly, a light emitting diode is not formed on the pseudo-pixel PXfb, so the pseudo-pixel PXfb cannot emit light.

Figure 9A:
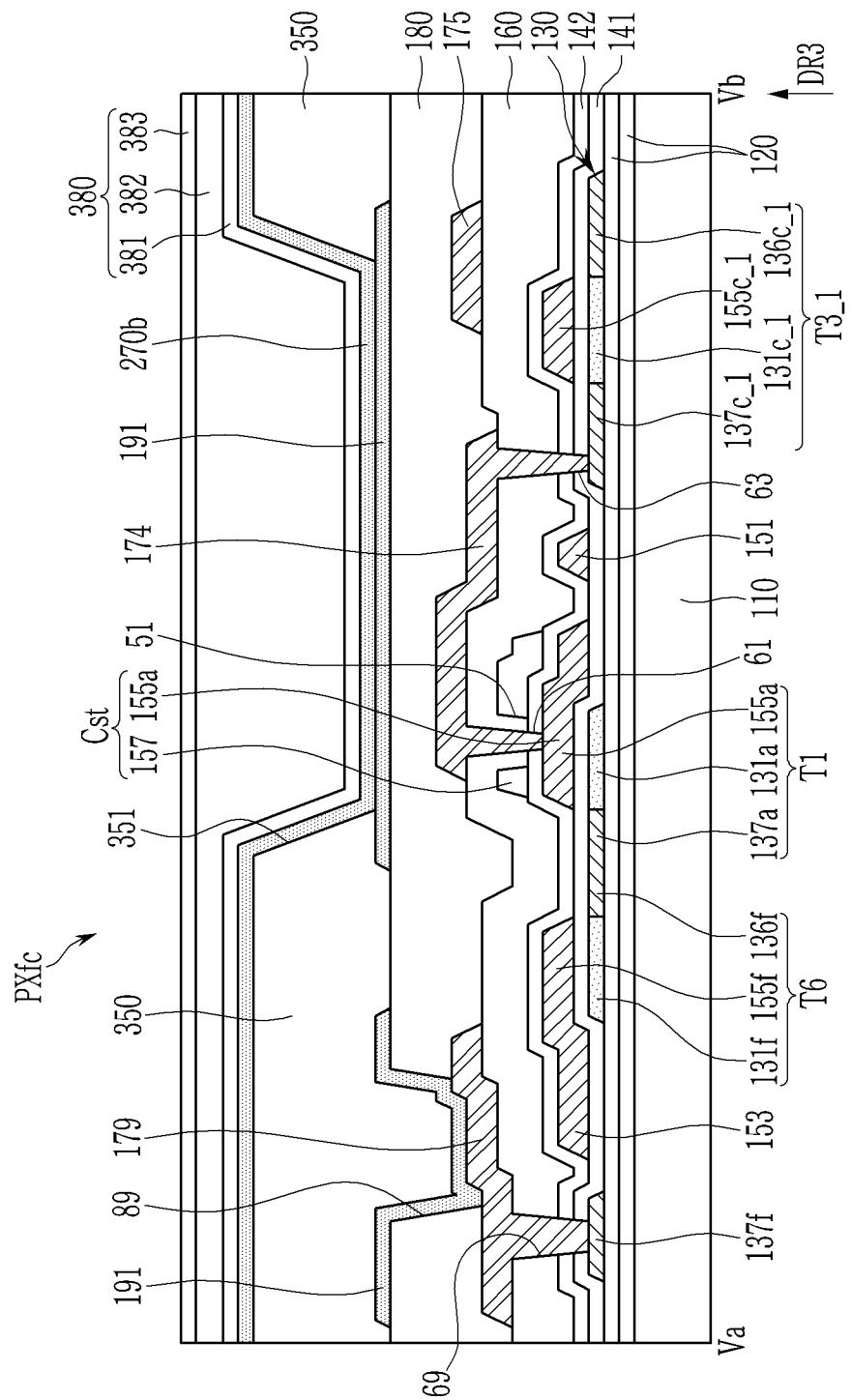
Figure 9B:
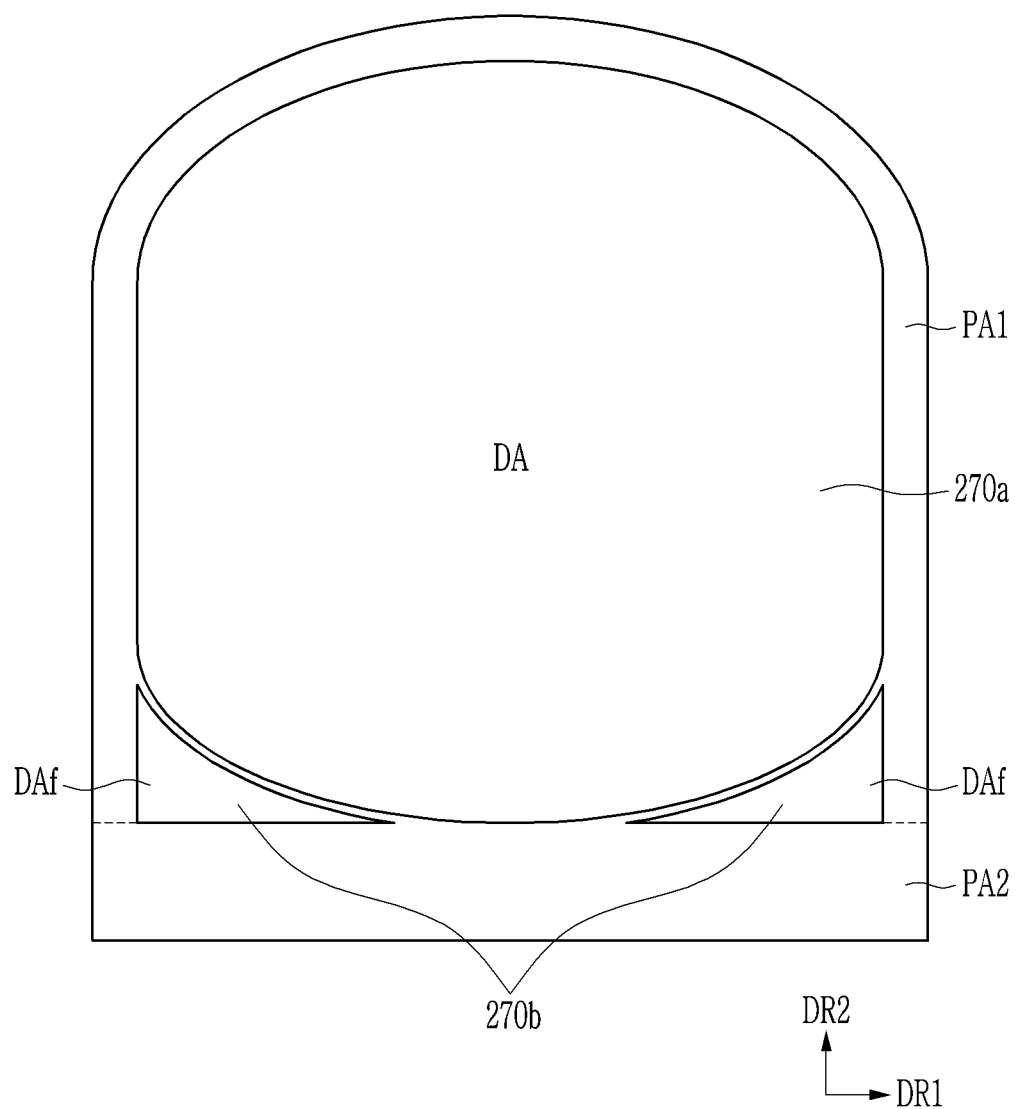
FIG. 9B shows a layout view of a display panel including a non-emitting pixel shown in FIG. 9A.

Referring to FIG. 9A and FIG. 9B, as an example of the pseudo-pixel PXf, a pseudo-pixel PXfc generally has the same configuration as the pixel PX, but the emission layer 370 may not be formed. Therefore, a common electrode 270b disposed in the non-display area DAf may contact the upper surface of the pixel electrode 191. Hence, a light emitting diode is not formed in the pseudo-pixel PXfc, so the pseudo-pixel PXfc cannot emit light.

Referring to FIG. 9B, in the present exemplary embodiment, the common electrode 270b disposed in the non-display area DAf may be electrically and physically separated from a common electrode 270a disposed in the display area DA. The common electrode 270a is generally the same as the above-described common electrode 270, but the common electrode 270a may be disposed only in the display area DA. The common electrode 270b provided in the non-display area DA may not receive a common voltage and may float.

Differing from that shown in FIG. 9A and FIG. 9B, the common electrodes 270a and 270b may be omitted in the non-display area DAf. In this case, in the non-display area DAf, the entire upper surface of the pixel electrode 191 may not contact the common electrode but may contact another layer (e.g., an insulating layer such as the encapsulation layer 380).

Figure 10:
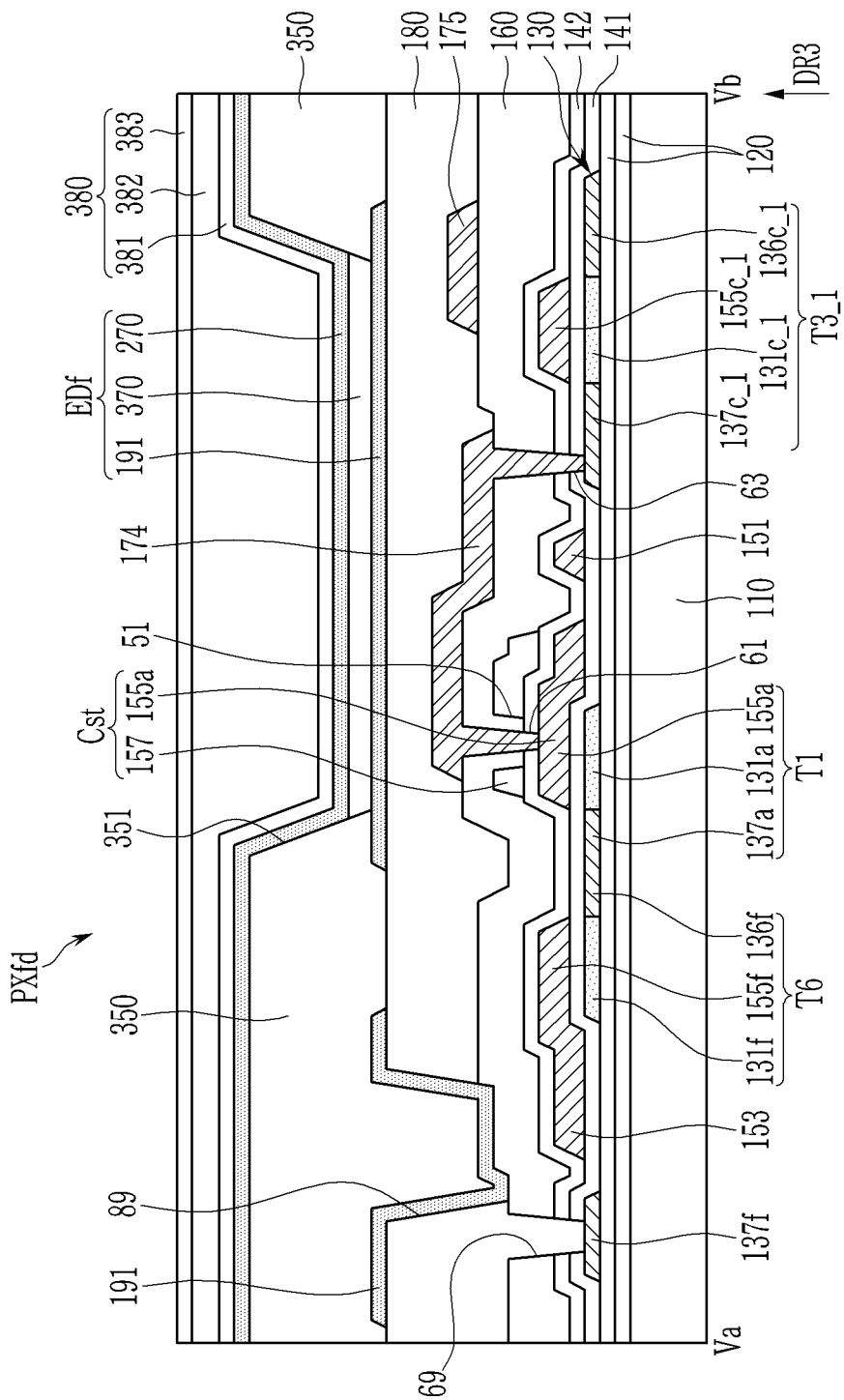
FIG. 10, FIG. 11, and FIG. 12 respectively show a cross-sectional view on a non-emitting pixel of a display panel according to an exemplary embodiment with respect to the line Va-Vb of FIG. 5.
Figure 11:
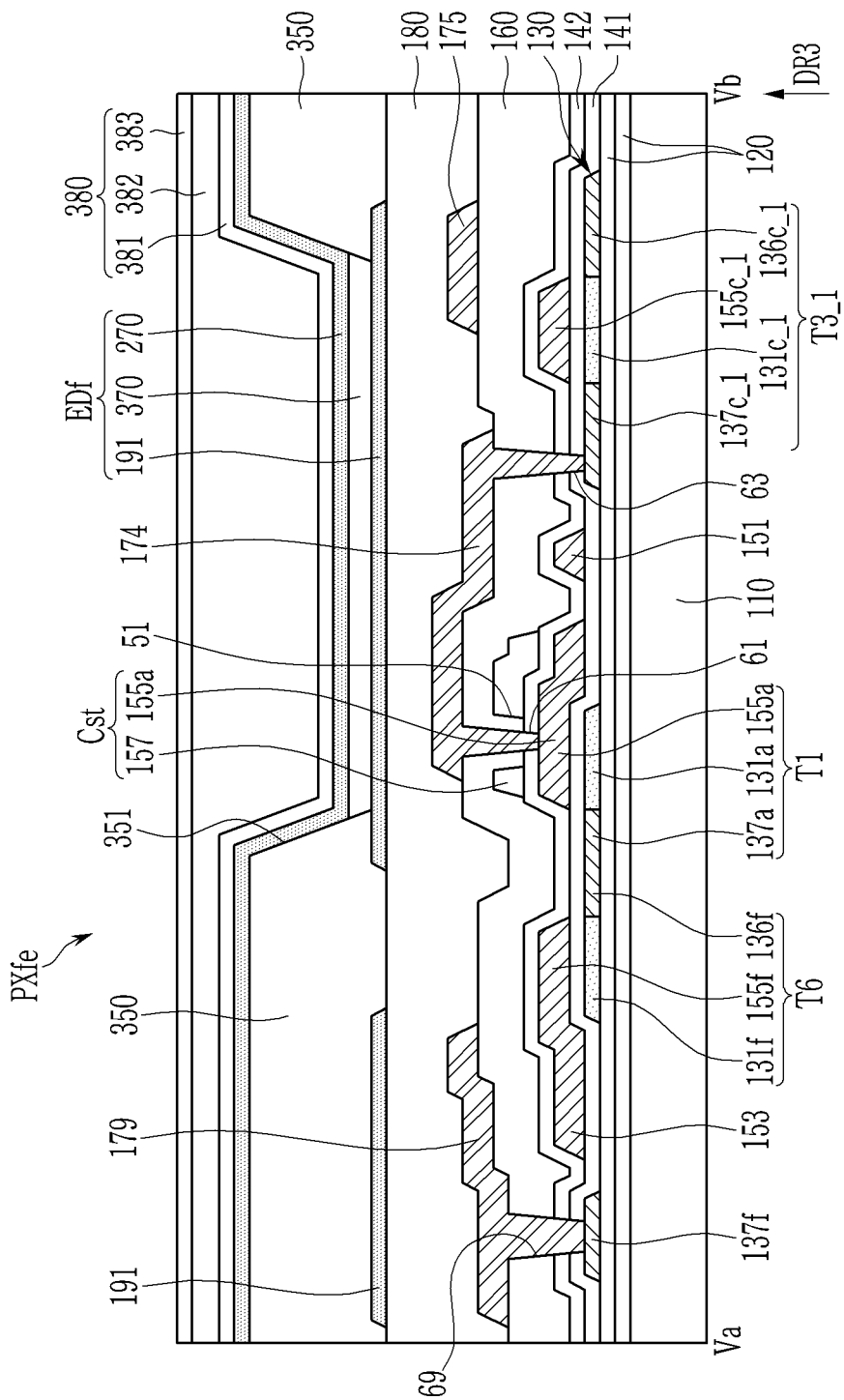

Referring to FIG. 10 and FIG. 11, as an example of the pseudo-pixel PXf, pseudo-pixels PXfd and PXfe generally have the same configuration as the pixel PX, but the pixel electrode 191 may not be electrically connected to any transistors, and it may not receive a voltage.

In detail, referring to FIG. 10, the pseudo-pixel PXfd generally has the same configuration as the pixel PX, but a connecting member 179 may not be formed. Therefore, the pixel electrode 191 may not be electrically connected to the transistor (e.g., the transistor T6) for transmitting a data voltage, and it may not receive a data voltage. Therefore, when the pixel electrode 191, the emission layer 370, and the common electrode 270 form a pseudo-light emitting diode EDf, and the display panel is driven, the pseudo-light emitting diode EDf of the pseudo-pixel PXfd may be turned off all the time and cannot emit light.

Differing from what is shown in FIG. 10, the connecting member 179 may or may not be formed, and the contact hole 69 of the third insulating layer 160 may not be formed, so the third insulating layer 160 may cover the entire upper side of the drain region 137f of the sixth transistor T6.

Referring to FIG. 11, the pseudo-pixel PXfe generally has the same configuration as the pixel PX, but the passivation layer 180 may not have a contact hole 89 disposed on the connecting member 179. Accordingly, the pixel electrode 191 may not be electrically connected to the connecting member 179 for receiving a data voltage, so it may not receive a data voltage. Therefore, when the pixel electrode 191, the emission layer 370, and the common electrode 270 form a pseudo-light emitting diode EDf, and the display device is driven, the pseudo-light emitting diode EDf of the pseudo-pixel PXfe may be turned off all the time and cannot emit light.

Figure 12:
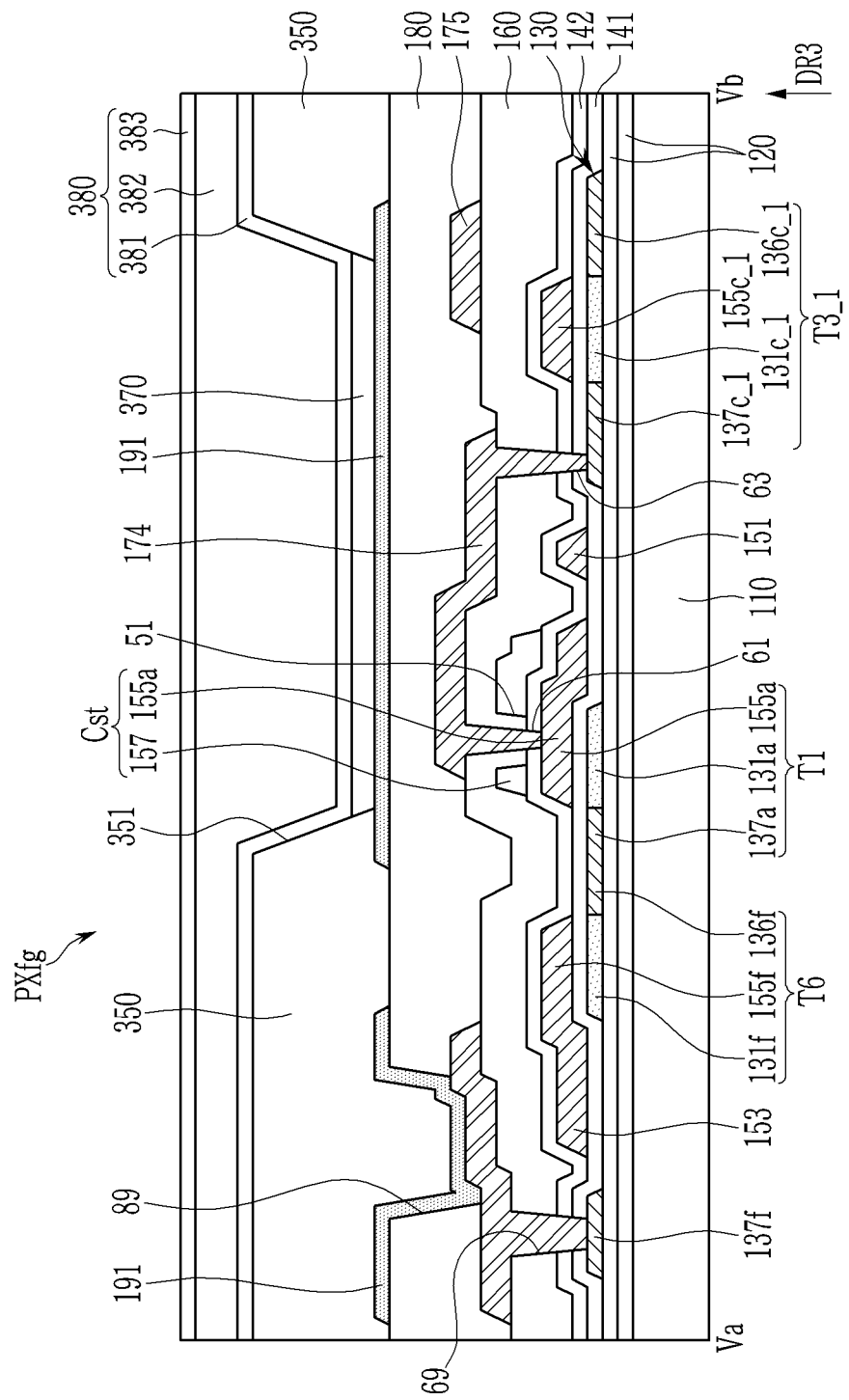

Referring to FIG. 12, as an example of the pseudo-pixel PXf, the pseudo-pixel PXfg generally has the same configuration as the pixel PX, but a common electrode 270 may not be formed on the emission layer 370 and the pixel defining layer 350. That is, the upper surface of the emission layer 370 may not be electrically connected to any electrodes. Accordingly, a light emitting diode is not formed on the pseudo-pixel PXfg, so the pseudo-pixel PXfg cannot emit light.

The display panel according to an exemplary embodiment may include various characteristics based on the respective characteristics of the pseudo-pixels PXfa, PXfb, PXfc, PXfd, PXfe, and PXfg shown in FIG. 7 to FIG. 12.

In addition to what is shown, the pseudo-pixel PXf may include various kinds of configurations in which a voltage may not be transmitted to the pixel electrode when the light-emitting element (e.g., a light emitting diode) is not formed, or it includes a pseudo-light emitting diode having the same configuration as the light emitting diode. For example, in the non-display area DAf, one or more layers of the active pattern 130 may be removed, at least the sixth transistor T6 may be omitted, one or more of the contact holes 61, 62, 63, 64, 65, 67, 68, and 69 in the insulating layer may be omitted, the first conductive layer may be removed, the third conductive layer may be removed, at least two of the above-listed omitted layers may be applied at the same time, or any combination of the above-listed omitted layers with the above-described other characteristics with reference to the figures may be applied. In these cases, a layer may be added, or the non-display area DAf may be formed without an additional configuration, thereby preventing a production cost from being increased.

Figure 13:
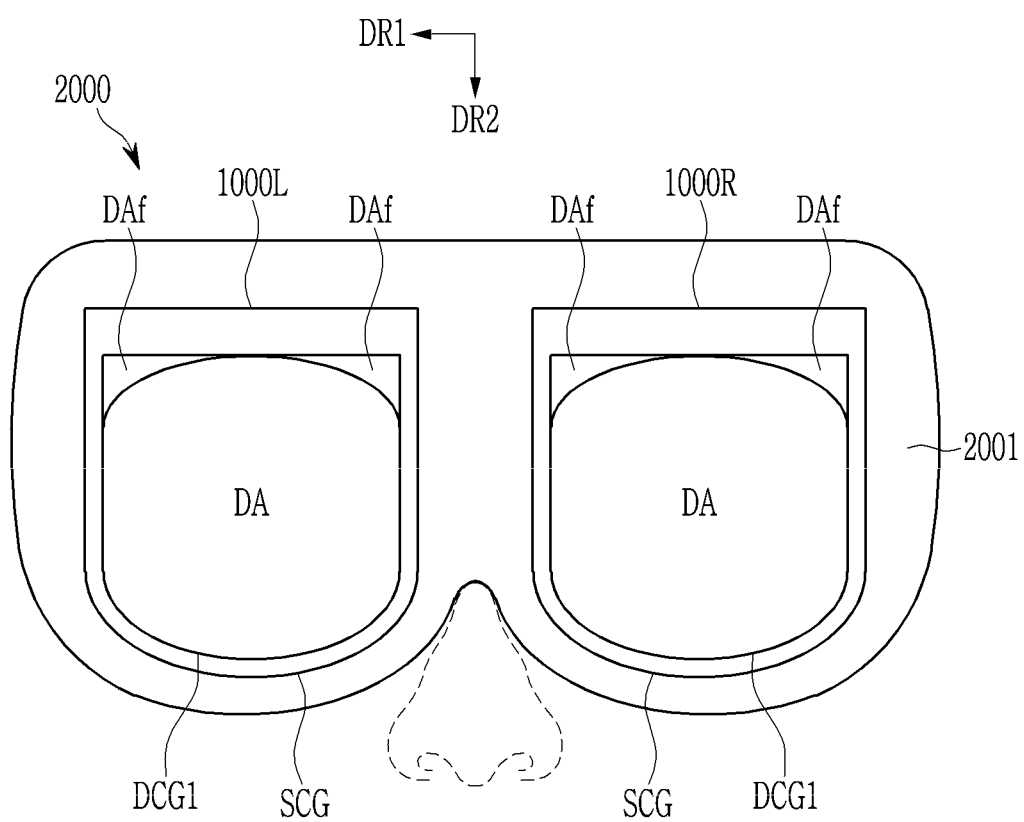
FIG. 13 shows a head-mounted display device including display panels according to an exemplary embodiment.

Referring to FIG. 13 together with the above-described drawings, the display device according to an exemplary embodiment may include one or more of the display panels 1000, 1000a, and 1000b according to the above-described exemplary embodiments. For example, a head-mounted display device 2000 may include a pair of display panels 1000L and 1000R, and a frame 2001 for fixing them according to an exemplary embodiment. The respective display panels 1000L and 1000R may display images that may be input to respective eyes of a user.

The respective display panels 1000L and 1000R may be disposed so that the curved edge SCG of the display panels 1000L and 1000R may be adjacent to a nose of the user. That is, wearability of the display device 2000 may be improved by disposing the non-display area DAf to be disposed upward and the curved edge SCG to be disposed downward and providing the curved edge SCG adjacent to the nose of the user. The boundary of the display panels 1000L and 1000R provided to be on a distant side from the nose of the user may not be bent in a like form of the curved edge SCG. The non-display area DAf is provided near the upper boundary of the display panels 1000L and 1000R so that the display area DA of the image viewed by the eyes of the user may be recognized to be a non-rectangular form, for example, a circular form or an oval form.

While the present disclosure has been described in connection with what is presently considered to be exemplary embodiments, it is to be understood that the present disclosure is not limited to the disclosed embodiments, but, on the contrary, is intended to cover various modifications and equivalent arrangements included within the spirit and scope of the present disclosure.

What is claimed is:

1. A display panel comprising
an active area and a peripheral area adjacent to the active area,
wherein the active area comprises a display area including a plurality of emitting pixels and a non-display area including a plurality of non-emitting pixels,
an emitting pixel of the plurality of emitting pixels comprises a first pixel structure including a light-emitting element, and
a non-emitting pixel of the plurality of the non-emitting pixels comprises a second pixel structure without including any light-emitting element,
wherein a boundary between the non-display area and the display area comprises a first curved edge.

2. The display panel of claim 1, wherein
the non-display area is adjacent to the display area.

3. The display panel of claim 1, wherein
the first curved edge does not overlap an internal area of any of the plurality of emitting pixels or the plurality of non-emitting pixels in a plane view.

4. The display panel of claim 1, further comprising:
a gate driver disposed in the peripheral area; and
a plurality of gate lines electrically connected to the gate driver,
wherein at least one of the plurality of gate lines extends in a first direction, crosses the first curved edge, and passes through the non-display area and the display area.

5. The display panel of claim 1, further comprising
a substrate that has an asymmetric form with respect to a reference line.

6. The display panel of claim 5, wherein
a boundary of the active area comprises the first curved edge and at least one second curved edge facing the first curved edge, and
the substrate comprises a third curved edge extending in parallel to the first curved edge.

7. The display panel of claim 6, wherein
the peripheral area comprises: a first peripheral area adjacent to the display area; and a second peripheral area adjacent to the non-display area, and
the second peripheral area is electrically connected to a circuit board.

8. The display panel of claim 7, wherein
the non-display area comprises a linear side facing the first curved edge, and
the linear side forms a boundary between the non-display area and the second peripheral area.

9. The display panel of claim 1, wherein
the light-emitting element of the emitting pixel comprises:
a first transistor;
a first insulating layer having a first contact hole disposed on a conductive region of the first transistor;
a first connecting member electrically connected to the conductive region of the first transistor through the first contact hole;
a second insulating layer having a second contact hole disposed on the first connecting member;
a first pixel electrode electrically connected to the first connecting member through the second contact hole;
a third insulating layer having a first opening disposed on the first pixel electrode;
a first emission layer disposed in the first opening; and
a first common electrode disposed on the first emission layer,
wherein the non-emitting pixel of the plurality of the non-emitting pixels comprises a pseudo-light-emitting element that is not capable of emitting light, and the pseudo-light-emitting element comprises a configuration of the light-emitting element of the emitting pixel excluding at least one of constituent elements of the light-emitting element of the emitting pixel among: a second transistor; a third contact hole formed in the first insulating layer and disposed on a conductive region of the second transistor; a second connecting member electrically connected to the conductive region of the second transistor through the third contact hole; a fourth contact hole formed in the second insulating layer and disposed on the second connecting member; a second pixel electrode electrically connected to the second connecting member through the fourth contact hole; a second opening formed in the third insulating layer and disposed on the second pixel electrode; a second emission layer disposed in the second opening; and a second common electrode disposed on the second emission layer.

10. A display panel comprising
an active area and a peripheral area adjacent to the active area,
wherein the active area comprises a display area including a plurality of emitting pixels, and a non-display area including a plurality of non-emitting pixels,
an emitting pixel of the plurality of emitting pixels comprises a light-emitting element for emitting light, and
a non-emitting pixel of the plurality of non-emitting pixels comprises a pseudo-light-emitting element that is not capable of emitting light.

11. The display panel of claim 10, wherein
the non-emitting pixel comprises:
a transistor;
a pixel electrode electrically connected to the transistor;
a first insulating layer disposed on the pixel electrode; and
a common electrode disposed on the first insulating layer, and
an entire upper surface of the pixel electrode is covered by the first insulating layer.

12. The display panel of claim 10, wherein
the non-emitting pixel comprises:
a transistor;
a first insulating layer disposed on the transistor;
a second insulating layer disposed on the first insulating layer and including an opening;
an emission layer disposed in the opening; and
a common electrode disposed on the emission layer,
wherein an entire lower surface of the emission layer contacts an upper surface of the first insulating layer.

13. The display panel of claim 10, wherein
the non-emitting pixel comprises:
a transistor;
a pixel electrode electrically connected to the transistor;
a first insulating layer having an opening overlapping the pixel electrode; and
a common electrode disposed on the pixel electrode, wherein, in the opening, an upper surface of the pixel electrode contacts the common electrode.

14. The display panel of claim 10, wherein the non-emitting pixel comprises:
a plurality of transistors;
a first insulating layer disposed on the plurality of transistors;
a pixel electrode disposed on the first insulating layer;
an emission layer disposed on the pixel electrode; and
a common electrode disposed on the emission layer, and
the pixel electrode is not electrically connected to the transistors.

15. The display panel of claim 10, wherein the non-emitting pixel comprises:
a transistor;
a pixel electrode electrically connected to the transistor; and
an emission layer disposed on the pixel electrode,
wherein an upper surface of the emission layer is not electrically connected to any electrodes.

16. A display panel comprising
a display area including a plurality of emitting pixels, and a non-display area adjacent to the display area and including a plurality of non-emitting pixels,
wherein an emitting pixel of the plurality of emitting pixels and a non-emitting pixel of the plurality of non-emitting pixels respectively comprise:
a substrate;
a transistor disposed on the substrate;
a common electrode disposed on the transistor; and
a first layer for contacting an upper surface of the common electrode,
wherein the emitting pixel comprises a first pixel electrode, and the non-emitting pixel comprises a second pixel electrode.

17. The display panel of claim 16, wherein
the emitting pixel further comprises a first emission layer contacting an upper surface of the first pixel electrode and a lower surface of the common electrode,
the first pixel electrode of the emitting pixel is electrically connected to the transistor,
the second pixel electrode of the non-emitting pixel is electrically connected to the transistor, and
an entire upper surface of the second pixel electrode is covered by an insulating layer.

18. A display panel comprising:
a display area including a plurality of emitting pixels, and a non-display area adjacent to the display area and including a plurality of non-emitting pixels,
wherein an emitting pixel of the plurality of emitting pixels and a non-emitting pixel of the plurality of non-emitting pixels respectively comprise:
a substrate;
a transistor disposed on the substrate;
a common electrode disposed on the transistor; and
a first layer for contacting an upper surface of the common electrode,
wherein the emitting pixel comprises: a first pixel electrode electrically connected to the transistor; and a first emission layer contacting an upper surface of the first pixel electrode and a lower surface of the common electrode,
the first pixel electrode of the emitting pixel is electrically connected to the transistor,
the non-emitting pixel comprises a second emission layer contacting a lower surface of the common electrode, and
a lower surface of the second emission layer is not electrically connected to any conductor.

19. A display panel comprising:
a display area including a plurality of emitting pixels, and a non-display area adjacent to the display area and including a plurality of non-emitting pixels,
wherein an emitting pixel of the plurality of emitting pixels and a non-emitting pixel of the plurality of non-emitting pixels respectively comprise:
a substrate;
a transistor disposed on the substrate;
a common electrode disposed on the transistor; and
a first layer for contacting an upper surface of the common electrode,
wherein the emitting pixel comprises: a first pixel electrode electrically connected to the transistor; and a first emission layer contacting an upper surface of the first pixel electrode and a lower surface of the common electrode, and
the non-emitting pixel does not comprise any emission layer.

* * * * *